United States Patent [19]
Chi

[11] Patent Number: 6,018,177
[45] Date of Patent: Jan. 25, 2000

[54] DRAM CELL AND ARRAY TO STORE TWO-BIT DATA

[75] Inventor: Min-Hwa Chi, Hsinchu, Taiwan

[73] Assignee: Vanguard International Semiconductor Corporation, Hsin-Chu, Taiwan

[21] Appl. No.: 09/257,836

[22] Filed: Feb. 25, 1999

Related U.S. Application Data

[62] Division of application No. 09/018,623, Feb. 4, 1998.

[51] Int. Cl.$^7$ .................................................. H01L 27/108
[52] U.S. Cl. .......................... 257/303; 257/296; 257/301; 257/304; 257/305; 257/306
[58] Field of Search ...................................... 257/301, 303, 257/304, 305, 306, 296; 438/243–244

[56] References Cited

U.S. PATENT DOCUMENTS

| | | | |
|---|---|---|---|
| 4,896,197 | 1/1990 | Mashiko | 357/23.6 |
| 5,066,608 | 11/1991 | Kim et al. | 437/52 |
| 5,146,425 | 9/1992 | Kang et al. | 365/149 |
| 5,217,918 | 6/1993 | Kim et al. | 437/52 |
| 5,234,854 | 8/1993 | An et al. | 437/47 |
| 5,410,509 | 4/1995 | Morita | 365/210 |
| 5,455,192 | 10/1995 | Jeon | 257/296 |
| 5,665,624 | 9/1997 | Hong | 438/244 |

*Primary Examiner*—Tom Thomas
*Assistant Examiner*—Thien F Tran
*Attorney, Agent, or Firm*—George O. Saile; Stephen B. Ackerman; Billy J. Knowles

[57] ABSTRACT

A DRAM cell capable of storing two bits of digital data as four levels of stored charge within the DRAM cell is disclosed. The four level DRAM cell has a pass transistor, a trench capacitor, and a stack capacitor. The pass transistors has a source connected to a bit line voltage generator to control placement of the charge within the four level DRAM cell, a gate connected to a word line voltage generator to control activation of the DRAM cells, and a drain. The trench capacitor has a top plate connected to the drain and a bottom plate connected to a substrate biasing voltage source. The stack capacitor has a first plate connected to the drain and a second plate connected to a coupling-gate voltage generator. The coupling-gate voltage generator will provide four levels of voltage that will indicate the level of charge to be stored within the four level DRAM cell. An interconnecting block that will interconnect the top plate of the trench capacitor to the first plate of the stack capacitor. The interconnection point between the trench capacitor and the stack capacitor will form the storage node that will retain the level of charge that indicates the state of the two bits of digital data. Four level DRAM cells will be arranged in a plurality of rows and columns to form an array of four level DRAM cells.

28 Claims, 6 Drawing Sheets

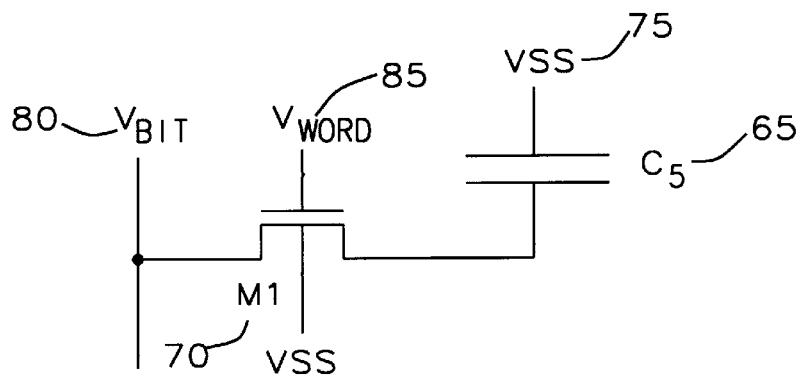
FIG. 1a – Prior Art
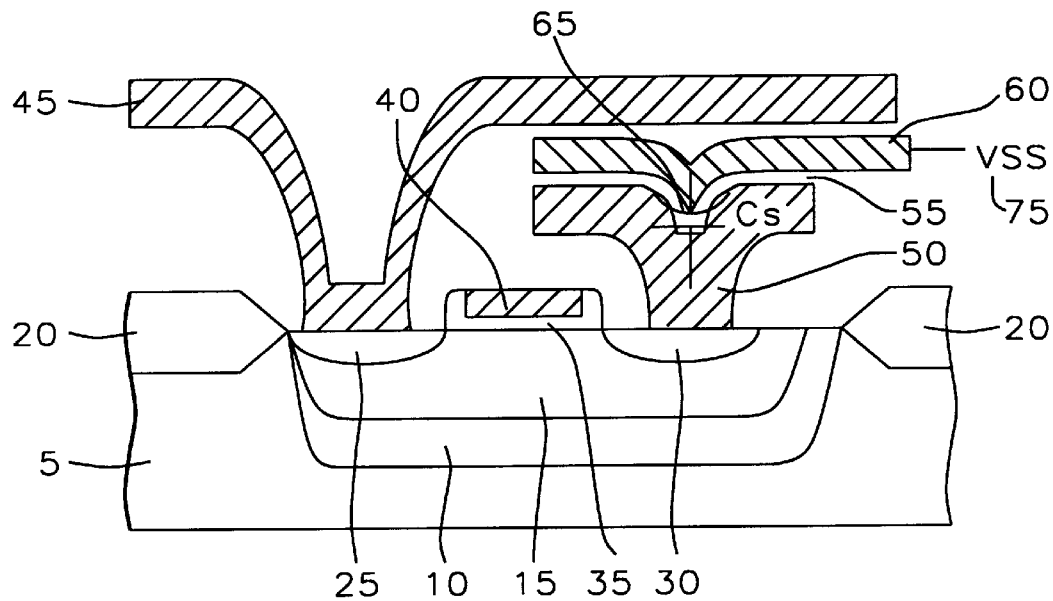
FIG. 1b – Prior Art
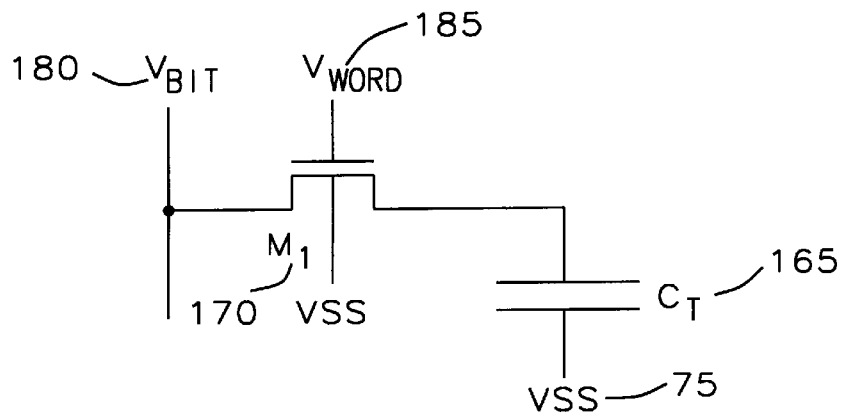
FIG. 1c – Prior Art

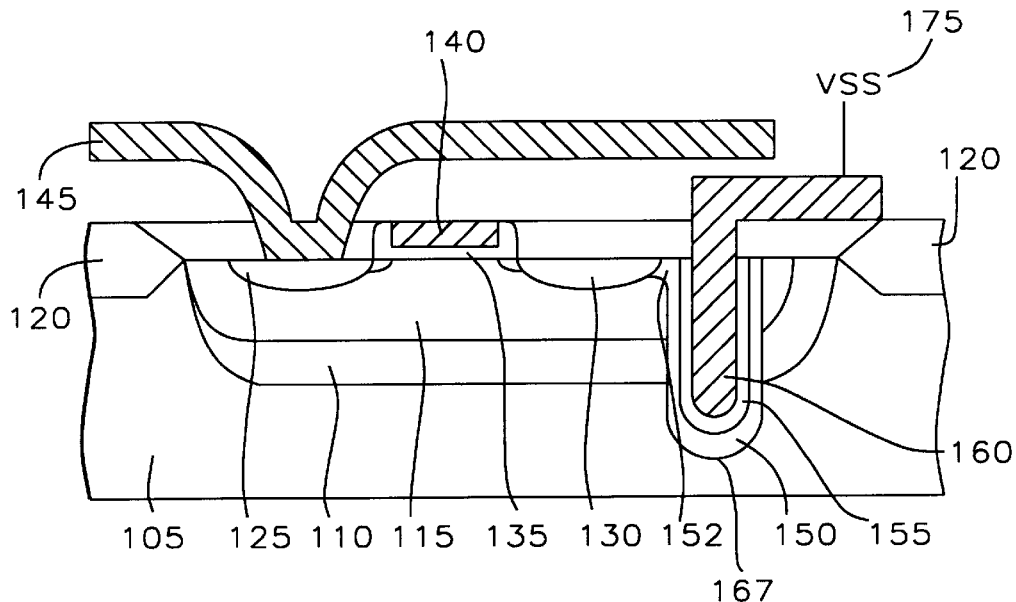
FIG. 1d – Prior Art
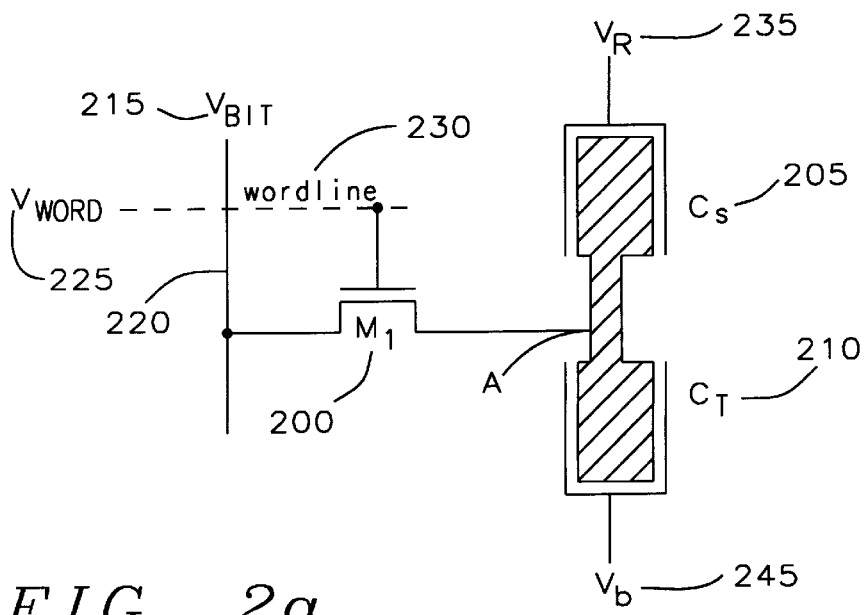
FIG. 2a

DRAM CELL AND ARRAY TO STORE TWO-BIT DATA

This is a division of patent application Ser. No. 09/018,623, filing date Feb. 4, 1998, Dram Cell And Array To Store Two-Bit Data, assigned to the same assignee as the present invention.

BACKGROUND OF THE INVENTION

1. Field Of The Invention

This invention relates to the dynamic random access memories (DRAM) and more particularly to the structures and methods of fabrication of DRAM's storing multiple data bits per DRAM cell.

2. Description of Related Art

The fabrication and structure of DRAM cells and DRAM arrays are well known in the art. Typical cell structures for high density DRAM in prior art is composed of one transistor $M_1$ 70 for switching charges and one storage capacitor C 65 for storing charges is illustrated in FIGS. 1a. The transistor $M_1$ 70 will be an n-MOS transistor fabricated as shown in FIGS. 1b. A deep N-well 10 will be formed in a p-type substrate 5. The area for DRAM cells will be formed as openings during the formation of insulation. The insulation is formed by the local oxidation of the silicon substrate (LOCOS) 20. Within the deep n-well 10 a shallower p-well 15 will be formed. The gate 40 of the n-MOS transistor $M_1$ 70 will be formed as a conductive material such as polysilicon placed over an insulating gate oxide 35 to define the channel area that will be between the drain 30 and source 25 of the n-MOS transistor $M_1$ 70.

The drain 30 and the source 25 will be formed by masking the semiconductor substrate 5 and implanting an $N^+$ material to form the $N^+$ drain 30 and the $N^+$ source 25. The gate 40 of the MOS transistor $M_1$ 70 will be connected to the word line control circuitry (not shown).

The capacitor C 65 is formed by placing a conductive metal connected to the substrate biasing voltage source $V_{ss}$ on a dielectric placed over the $N^+$ drain of the transistor $M_1$ 70. The capacitor C 65 as shown is diagrammatic. The particular structure of the capacitor C 65 is well known and shown in "The Evolution Of DRAM Cell Technology" by B. El-Kareh et al., Solid State Technology, May 1997, pp. 89–101. In order to maintain the minimum storage capacitance of 30–40 fF of a cell, the structure of the DRAM cell results in complex semiconductor processing to develop these structures.

Refer now to FIGS. 1c and 1d, The trench capacitor $C_T$ 165 is formed by etching a deep trench 167 in the surface of the semiconductor substrate 105. An $N^+$ material is implanted in the surface of the trench 167 and to the $N^+$ drain 130 to form an $N^+$ strap 152. An insulating material such as oxidized silicon nitride ONO, silicon dioxide, or silicon nitride will then be deposited on the surface of the trench 167 to form the capacitor dielectric 155. A conductive material such as polysilicon will be deposited in the trench 167 to fill the trench 167. The polysilicon "plug" 160 will then be attached to the substrate biasing voltage source $V_{ss}$ 175 to form a bottom plate of the capacitor $C_T$ 165. The top plate of the capacitor $C_T$ 165 will be the $N^+$ diffusion 150 that is connected by the $N^+$ strap 152 to the $N^+$ drain 130 of the MOS transistor $M_1$ 170. Again FIG. 1d is diagrammatic. The particular structure is well known in the art and illustrated in B. El-Kareh et al.

The deep n-well 110 is typically biased to the power supply voltage source $V_{cc}$ (i.e. the highest potential on chip) and the p-well is biased to substrate biasing voltage source $V_{ss}$ 175 (i.e. the lowest voltage on chip). The substrate biasing voltage source $V_{ss}$ 175 may be biased below ground (i.e. negative potential) so that the leakage current through the pass transistor is reduced. The presence of charge in the storage capacitor C 165 indicates a logical "1" and its absence of charge indicates a logical "0". The storage capacitor C 165 is connected to $N^+$ drain 130 of the transistor M1 170, and the other $N^+$ source 125 of the transistor M1 170 is connected to bit-line $V_{bit}$ 180 that controls the reading and writing of the DRAM cell. The gate 140 of the MOS transistor $M_1$ 170 is connected to the word line $V_{word}$ 185 to control the selection of the DRAM cell.

U.S. Pat. No. 4,896,197 (Mashiko) describes a DRAM cell incorporating a trench capacitor to store one bit and a stack capacitor to store a second bit. A first pass transistor controls the charge of the trench capacitor, while a second pass transistor controls the charge of the stacked capacitor.

U.S. Pat. No. 5,066,608 (Kin et al.) describes a method for manufacture of a stacked-trench capacitor. The stacked-trench capacitor will incorporate both a trench capacitor and stack capacitor to increase the capacitance of the DRAM cell.

U.S. Pat. No. 5,217,918 (Kim et al.) discloses an integrated semiconductor memory device incorporating stacked capacitors and combined stack-trench capacitors to form column and rows of memory cells. The stacked capacitors are the stack-trench capacitors are alternated to allow improved density, while preventing leakage current and soft errors.

U.S. Pat. No. 5,234,854 (An et al.) describes a method for manufacturing a stack-trench capacitor.

U.S. Pat. No. 5,410,509 (Morita) discloses a DRAM array employing a combination of stacked capacitor memory cells and trench capacitor memory cells to form the array. The stacked capacitor memory cells will occupy on column of the array while the trench capacitor memory cells will occupy alternate columns of the memory array. The memory array will also have the stacked capacitor cells and the trench capacitor memory cells used as dummy memory cells within the array. The structure of the memory array is such that when the stacked capacitor memory cells are selected, the dummy stacked memory cells are selected and like wises for the trench capacitor memory cells and the dummy trench capacitor memory cells.

U.S. Pat. No. 5,455,192 (Jeon) describes a method of fabricating a DRAM cell incorporating stacked capacitors and trench capacitors. The structure of the stacked capacitors and the trench capacitors is such that the stacked capacitors and the trench capacitors are connected in parallel to increase the capacitance of the DRAM cell.

SUMMARY OF THE INVENTION

An object of this invention is to provide a DRAM cell capable of storing two bits of digital data as four levels of stored charge within the DRAM cell.

Another object of this invention is to provide a DRAM cell incorporating a stacked capacitor and a trench capacitor.

Further another object of this invention is to provide an array of DRAM cells, each DRAM cell capable of storing two bits of digital data.

Still further another object of this invention is to provide a method of fabrication of a DRAM cell capable of storing two bits of digital data.

To accomplish these and other objects, a four level DRAM cell has a pass transistor, a trench capacitor, and a stack capacitor. The pass transistors has a source connected to a bit line voltage generator to control placement of the charge within the four level DRAM cell, a gate connected to a word line voltage generator to control activation of the DRAM cells, and a drain. The trench capacitor has a top plate connected to the drain and a bottom plate connected to a substrate biasing voltage source. The stack capacitor has a first plate connected to the drain and a second plate connected to a coupling-gate voltage generator. The coupling-gate voltage generator will provide four levels of voltage that will indicate the level of charge to be stored within the four level DRAM cell. An interconnecting block that will interconnect the top plate of the trench capacitor to the first plate of the stack capacitor. An insulating layer will isolate the stack capacitor from the trench capacitor. The interconnection point between the trench capacitor and the stack capacitor will form the storage node that will retain the level of charge that indicates the state of the two bits of digital data.

A plurality of four level DRAM cells will be arranged in a plurality of rows and columns to form an array of four level DRAM cells. A plurality of word lines will interconnect the gate of each pass transistor of each row of the four level DRAM cells. A bit line is located on each column of four level DRAM cells and is connected to the source of the pass transistor of each four level DRAM cell on each column of four level DRAM cells, and a coupling-gate line is located additionally on each column of four level DRAM cells and connected to the second plate of the stacked gate capacitor.

A word line control circuit is coupled to each word line to selectively activate all the four level DRAM cells of one row of four level DRAM cells. A bit line control circuit is connected to each bit line to establish a necessary bit line voltage level during a writing and reading of the four level DRAM cells on a column of four level DRAM cells.

A four level sense amplifier is connected to each bit line to sense a level of charge representing the two bits of digital data retained within the four level DRAM cell. A coupling-gate control circuit is coupled to each of the coupling-gate lines to provide a necessary coupling-gate voltage level during writing and reading of the four level DRAM cells on a column of four level DRAM cells. A peripheral control circuit will provide control signals for the plurality of word line control circuits, bit line control circuits, four level sense amplifiers, and coupling-gate control circuits.

BRIEF DESCRIPTION OF THE DRAWINGS

FIGS. 1a and 1b show a schematic diagram and a cross sectional view of a stack capacitor DRAM cell of the prior art.

FIGS. 1c and 1d show a schematic diagram and a cross sectional view of a trench capacitor DRAM cell of the prior art.

FIGS. 2a and 2b show a schematic diagrams of a four level DRAM cell of this invention.

DETAILED DESCRIPTION OF THE INVENTION

Figure 2B:
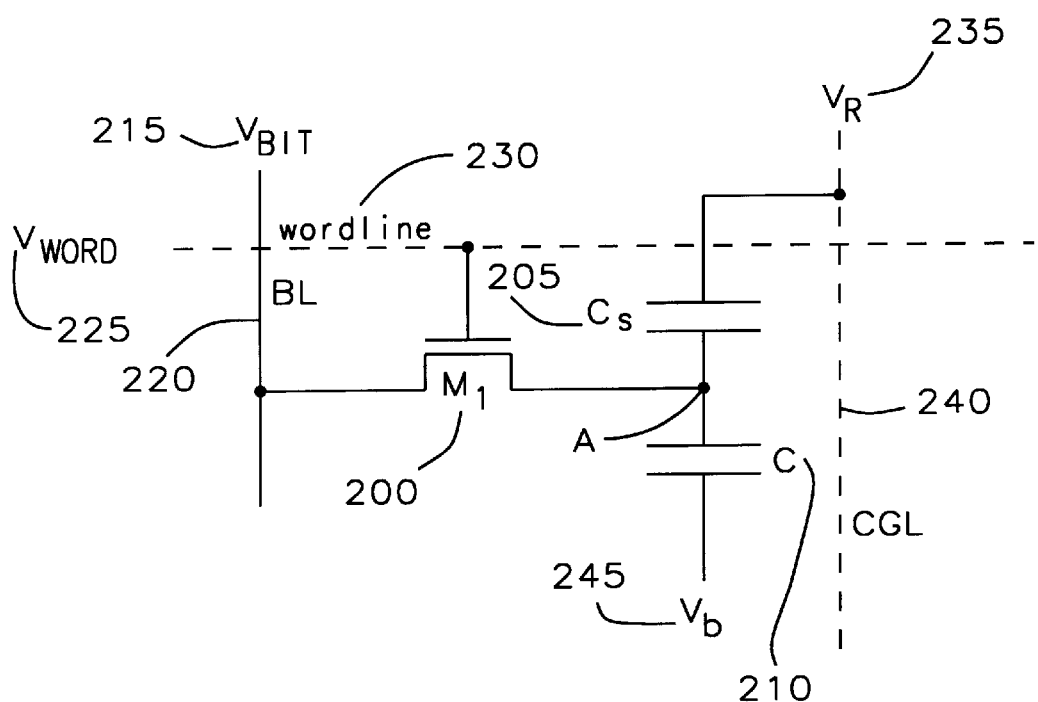

Refer now to FIGS. 2a and 2b to understand the structure of the four level DRAM cell of this invention. The N-MOS transistor $M_1$ 200 acts as a pass transistor to transfer the digital data in the form of an electrical charge from the bit line voltage generator $V_{bit}$ 215 on the bit line 220 to the storage node A. The word line voltage generator $V_{word}$ 225 will be boosted to a level higher that the power supply voltage source $V_{cc}$ to activate the pass transistor $M_1$ 200 through the word line 230.

A stack capacitor $C_s$ 205 will be coupled between the storage node A and a coupling-gate voltage generator $V_R$ 235 through the coupling-gate line 240. The coupling-gate voltage generator $V_R$ 235 will act as a second "bit line" voltage generator to control the level of charge stored at the storage node A. A trench capacitor will be coupled from the storage node A to the semiconductor substrate biasing generator $V_b$ 245.

The storage node A will be formed as a layers of polysilicon 250 as will be more completely described hereinafter.

During a write operation the word line voltage generator $V_{word}$ 225 will be placed at a voltage level that is higher than that of the power supply voltage source $V_{cc}$ using charge pump circuitry, to activate the pass transistor $M_1$ 200. Typically the word line voltage generator $V_{word}$ 225 will provide a voltage level that is approximately the is the power supply voltage source $V_{cc}$ plus 1.0V. This is well known in DRAM operation. The bit line voltage generator $V_{bit}$ 215 will be placed at a voltage level that is one half the value of the power supply voltage source ($V_{cc}/2$) and the substrate biasing voltage generator will be placed at a voltage level that is the negative of one half of the power supply voltage source ($-V_{cc}/2$). The voltage level $V_A$ at the storage node A is simply one half the power supply voltage source ($V_{cc}/2$), since the pass transistor is turned on, that is the voltage $V_A = V_{bit} = V_{cc}/2$. To write the two bits of digital data to the storage node A, the coupling-gate voltage generator $V_R$ 235 will be set to the voltage levels as follows in Table 1:

TABLE 1

Discrete $V_R$ Levels Applied During Write Operation

| Digital Data | $V_R$ |
|---|---|
| 00 | $V_{CC}$ |
| 01 | $V_{CC}/2$ |
| 10 | 0 |
| 11 | $-V_{CC}/2$ |

The charge $Q_s$ placed at the storage node A will be determined as $$Q_s = C(V_A - V_R) + C(V_A - V_b) \quad (1)$$
$$= 2CV_A - C(V_R + V_b)$$

where:
C is the capacitance of the stack capacitor $C_s$ 205 or the trench capacitor $C_T$ 210 and the values of the stack capacitor $C_s$ 205 and the trench capacitor $C_T$ 210 are equal to the capacitance C, $V_A = V_{bit} = V_{cc}/2$, and $V_b = V_{cc}/2$.

As the coupling-gate voltage generator $V_R$ 235 varies in four discrete levels, there are four discrete charge levels $Q_s$ stored at the storage node A. These levels are shown below in Table 2:

TABLE 2

Four Levels Of Charge Stored In Cell After Write Operation

| Digital Data | $Q_S/C$ (Stored Charge in Cell) |
|---|---|
| 00 | $V_{CC}/2$ |
| 01 | $V_{CC}$ |
| 10 | $3V_{CC}/2$ |
| 11 | $2V_{CC}$ |

One consideration, once the four level DRAM cell of this invention has been written, is the voltage between the bit line 220, the word line 230, the coupling-gate line 240, and the semiconductor substrate. If the voltage across the gate oxide of the n-MOS transistor $M_1$ 200 and the capacitor dielectric of the stack capacitor $C_s$ 205 and the trench capacitor $C_T$ 210 exceed twice the level of the power supply voltage source, there is a danger of damage to the insulating materials of the gate oxide of the n-MOS transistor $M_1$ 200 or the capacitor dielectric of the stack capacitor $C_s$ 205 and the trench capacitor $C_T$ 210. To alleviate this the word line voltage generator $V_{word}$ 230 and the coupling-gate voltage generator $V_R$ 235 will be placed at a level of the ground reference potential (OV). The substrate biasing voltage generator $V_b$ 245 will be placed at the level of the negative of one half the power supply voltage source ($-V_{cc}/2$). The level of the voltage $V_A$ at the storage node A can be easily derived from equation 1 in terms of the voltage level of the coupling-gate voltage generator $V_R$ 235, the voltage level of the substrate biasing voltage generator $V_b$ 245 and the net charge $Q_s/C$ stored at the storage node A is as follows:

$$V_A = 1/2\left(\frac{Q_s}{C} + V_R + V_b\right) \quad (2)$$
$$= \frac{Q_s}{2C} + \left(\frac{V_R + V_b}{2}\right)$$

Therefore during the write operation, the voltage level $V_A$ at the storage node A can be calculated from equation 2 and the discrete values of the voltage level of the coupling-gate voltage generator $V_R$ 235 and the net charge $Q_s/C$ stored at the storage node A from table 1 and table 2. The voltage level $V_A$ will be as shown in Table 3.

TABLE 3

$V_A$ Levels During Write Operation

| Digital Data | $V_A$ (During Write Operation) |
|---|---|
| 00 | 0 |
| 01 | $V_{CC}/4$ |
| 10 | $V_{CC}/2$ |
| 11 | $3V_{CC}/4$ |

It will be apparent that the worse case voltage level $V_{ox}$ developed across the gate oxide of the n-MOS pass transistor $M_1$ 200. The voltage level will be the difference between voltage level word line voltage generator $V_{word}$ 225 and the voltage $V_A$ at the storage node A. That is $V_{ox} = V_{word} - V_A$. The voltage level $V_{ox}$ is the same as is found in conventional DRAM design of the prior art.

The read operation of the four level DRAM cell of this invention begins by placing the word line voltage generator $V_{word}$ 225 at the voltage level that is higher than the power supply voltage source ($V_{cc}$) using the charge pump circuitry. The charge pump circuitry will provide the voltage level that is approximately the power supply voltage source $V_{cc}$ plus 1.0V, as described above. This voltage level will activate the n-MOS transistor $M_1$ 200. The bit line voltage generator $V_{bit}$ 215 will precharge the bit line 220 to a voltage level that is one half that of the power supply voltage source ($V_{cc}/2$). The coupling-gate voltage generator $V_R$ 235 will be placed at the level of the ground reference potential (OV) and the substrate biasing voltage generator $V_b$ 245 will be placed at the voltage level that is the negative of one half of the power supply voltage source ($-V_{cc}/2$).

During the read operation the charge present at the storage node A will flow into a sense amplifier through the bit line BL 220. The voltage $V_A$ at the storage node A will, eventually, be equal to that of the voltage $V_{bit}$ of the bit line 220.

After the voltage $V_A$ at the storage node A and the voltage $V_{bit}$ of the bit line 220 have equalized, the charge $Q_r$ remaining at the storage node A, after the read operation, can be calculate from equation 1 by substituting $Q_s$ with $Q_r$ and setting the voltage $V_A$ at the storage node A equal to the voltage $V_{bit}$ of the bit line 220 equal to one half the power supply voltage source $V_{cc}/2$. The coupling-gate voltage generator $V_R$ 235 will be placed at the level of the ground reference potential (OV) and the substrate biasing voltage generator $V_b$ 245 will be placed at the voltage level that is the negative of one half of the power supply voltage source ($-V_{cc}/2$). The results will be:

$$\frac{Q_r}{C} = 3V_{cc}/2 \quad (3)$$

The total amount of charge $Q_o$ that flows during the read operation is simply the difference of charges at the storage node A before and after the read operation, that is:

$$Q_o = Q_s - Q_r \quad (4)$$

Therefore the charge that was sensed during the read operation to determine the digital data retained at the storage node A is shown in Table 4. The sign of the magnitude of the charge flow $Q_o/C$ will designate the direction of charge flow $Q_o/C$. That is, if the magnitude of the charge flow $Q_o/C$ is positive (+), the charge flow $Q_o/C$ will flow from the DRAM cell. And if the magnitude of the charge flow $Q_o/C$ is negative (−), the charge flow $Q_o/C$ will flow into the DRAM cell.

TABLE 4

Discrete Levels Of Charge That Flow From DRAM Cell

| Digital Data | $Q_O/C$ Charge Flow into Sense Amplifier |
|---|---|
| 00 | $-V_{CC}$ |
| 01 | $-V_{CC}/2$ |
| 10 | 0 |
| 11 | $V_{CC}/2$ |

Figure 3:
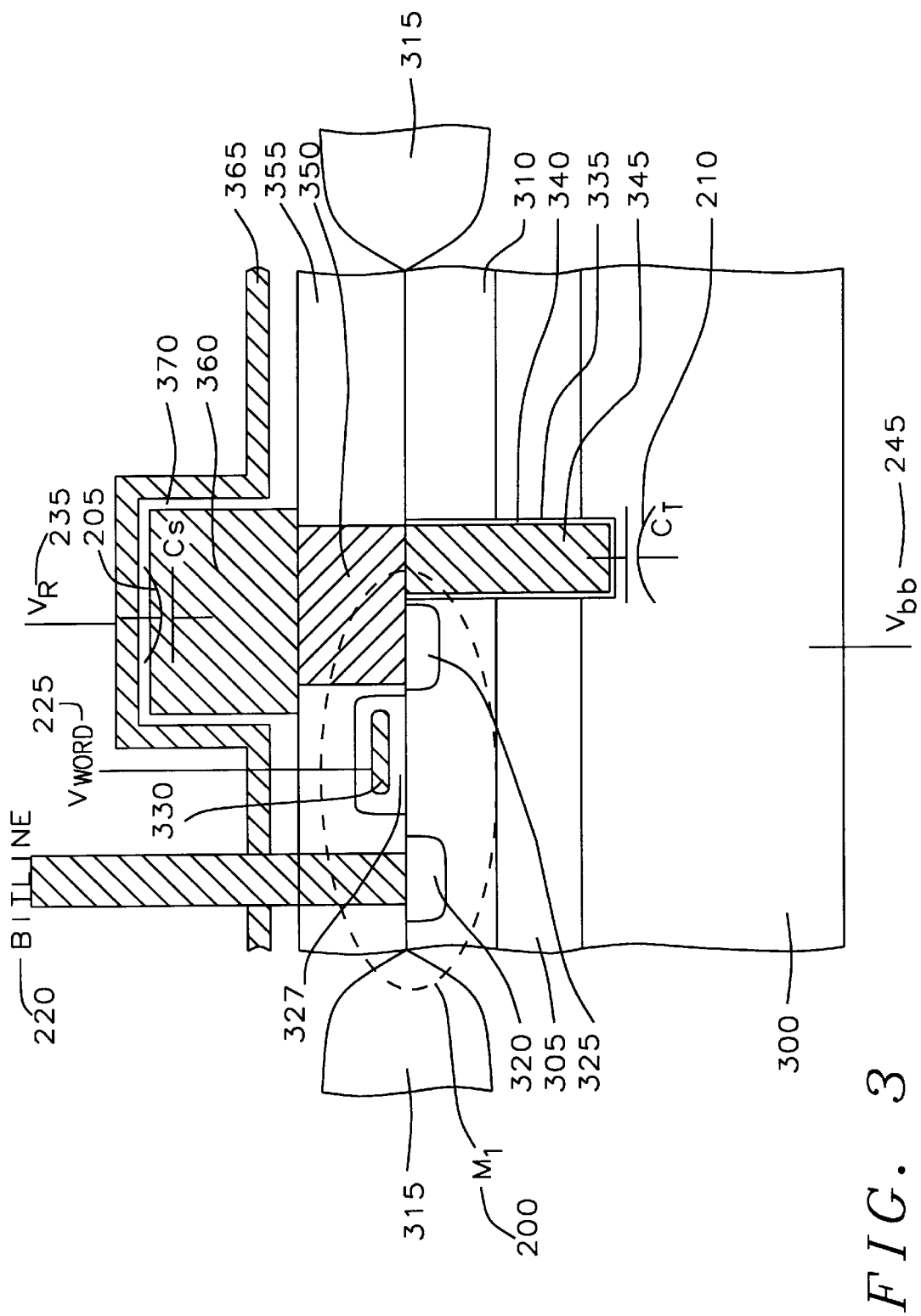
FIG. 3 shows a cross sectional view of a four level DRAM cell of this invention.

Referring now to FIG. 3 to examine the basic structure of the four level DRAM cell of this invention. The fabrication method of a four level DRAM cell of this invention begins with a silicon substrate 300 with a P-type impurity. A deep N-well 305 is formed by the implantation of an N-type impurity into the P-substrate 300. The P-type impurity is then implanted into the deep N-well 305 to form the shallow P-well 310. A localized oxidation of silicon (LOCOS) 315 will grow regions of isolation that will define the area of the four level DRAM cell. A trench 335 that will define the trench capacitor $C_T$ 210 will be etched in the surface of the semiconductor substrate. An insulating materials ONO1 340 that will be a combination of silicon dioxide and silicon nitride will be deposited on the interior surface of the trench 335 to form the capacitor dielectric ONO1 340 of the trench capacitor $C_T$ 210. The trench 335 will then be filled by the deposition of a first polysilicon material POLY1 345 to form the top plate of the trench capacitor $C_T$ 210.

The gate oxide 327 will be grown on the surface of the semiconductor. On the gate oxide 327 a conducting layer, such as polysilicon or tungsten, will be deposited and etched to form a gate 330. A mask is then used for implanting a N-type lightly doped drain region NLdd at the drain 325. Then an oxide spacer is formed by depositing a layer of oxide and then etched back. Then a mask is used for an $N^+$ implant to form the source 320. The gate 330, source 320, and drain 325 will form the pass transistor $M_1$ 200.

A first insulating layer IPO 355 will be placed on the surface of the semiconductor substrate. In an opening of the first insulating material IPO 355, an second polysilicon material POLY2 350 will be deposited on the first polysilicon POLY1 345 and the drain NLDD 325 to connect the top plate of the trench capacitor $C_T$ 210 to the drain NLDD 325 of the n-MOS transistor $M_1$ 200.

A third polysilicon material POLY3 360 is deposited to contact the second polysilicon material POLY2 350. This third polysilicon material POLY3 360 will form the first plate of the stack capacitor $C_s$ 205. On the surface of the first insulating material IPO 355, a second insulating material ONO2 370 will be deposited. The second insulating material ONO2 370 will form the capacitor dielectric of the stack capacitor $C_s$ 205. On the capacitor dielectric ONO2 370 a fourth polysilicon material POLY4 365 will be deposited to form the second plate of the stack capacitor $C_s$ 205.

The source 320 of the n-MOS transistor $M_1$ 200 will be connected to the bit line 220. The gate of the n-MOS transistor $M_1$ 200 will be connected through the word line to the word line voltage generator $V_{word}$ 225 and the second plate POLY4 365 will be connected through the coupling-gate line to the coupling-gate voltage generator $V_R$ 235. The P-substrate 300 will be connected to the substrate biasing voltage generator $V_b$ 245.

Figure 4:
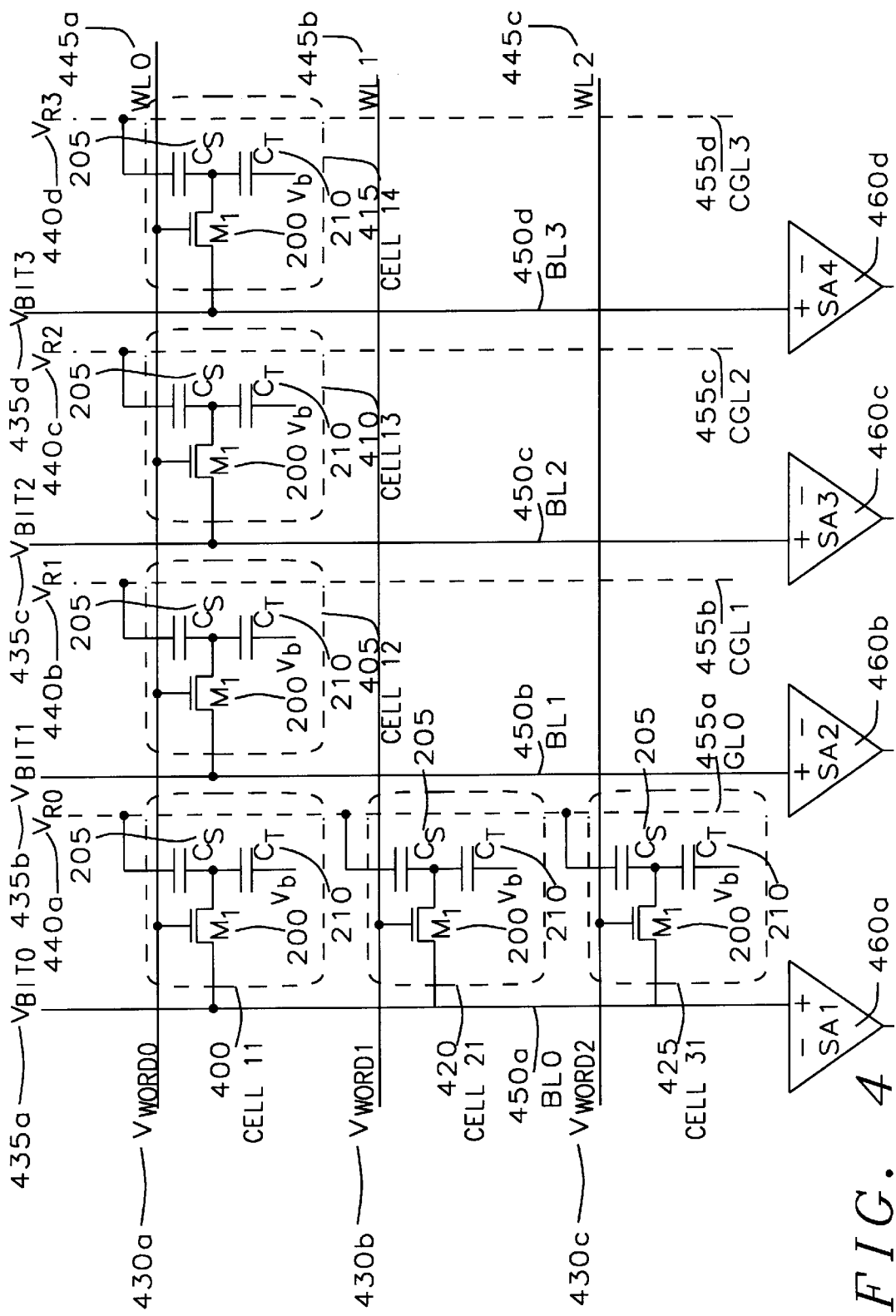
FIG. 4 shows a partial schematic of an array of four level DRAM cells of this invention.

FIG. 4 shows a representative portion of an array of four level DRAM cells of this invention. Multiple four level DRAM cells Cell 400, Cell12 405, Cell13 410, Cell14 415, Cell21 420, Cell31 425 are arranged in rows and columns to form the array. Each row of four level DRAM cells will be connected to a word line. For instance, four level DRAM cells Cell 400, Cell12 405, Cell13 410, Cell14 415 are connected to word line 0 445a, which in turn is connected to the word line voltage generator $V_{word0}$ 430a.

Each column of four level DRAM cells is connected to a bit line. Again as an example, four level DRAM cells Cell11 400, Cell21 420, Cell31 425 are connected to the bit line 0 450a, which in turn is connected to the bit line voltage generator $V_{bit0}$ 435a. Also, each four level DRAM cell is connected to a coupling-gate line. The four level DRAM cells Cell11 400, Cell21 420, Cell31 425 will be connected to the coupling-gate line 0. The coupling-gate line 0 is connected to the coupling-gate voltage generator $V_R$ 440a.

A four level sense amplifier SA1 460a, SA2 460b, SA3 460c, SA4 460d will detect the level of charge flowing from a selected four level DRAM cell and determine the two bits of digital data retained in the selected four level DRAM cell.

Referring back to FIGS. 2a and 2b, during a write operation, those cells that have not been selected will be disturbed by the voltage placed on the selected coupling-gate line 240 by the coupling-gate generator 235. If the two bits of digital data to be written to the selected cell are 00, then the rest of the four level DRAM cells on the column (as shown in FIG. 4) will have the level of the power supply voltage source $V_{cc}$ present on the coupling-gate line 240. The voltage level of the word line 230 will be at the level of the ground reference potential (0V). The n-MOS transistor $M_1$ 200 will be deactivated insuring that no charge is transferred from the storage node A to the bit line 220.

The substrate biasing voltage generator $V_b$ 245 will be set to the level that is the negative of one half of the power supply voltage source $(-V_{cc}/2)$. The charge stored at the storage node A will not vary. However, the voltage at the storage node A will vary according to the level of the coupling-gate voltage generator $V_R$ 235. The voltage $V_A$ at the storage node A under a disturb mode can be calculated from equation 2. A worst case occurs when unselected cells are disturbed in the same column while a digital data of 00 is being written. The voltage $V_a$ at the storage node A disturbed by a digital data pattern of 00 being written to another location is shown in equation 5. The coupling-gate voltage generator $V_R$ 235 is set to the power supply voltage source $V_{cc}$ and the substrate biasing voltage generator $V_b$ 245 is set to one half the negative of the power supply voltage source $(-V_{cc}/2)$. The disturbed voltage will be:

$$V_{AD} = Q_s/2C + V_{cc}/4 \tag{5}$$

The disturbed voltage $V_{AD}$ at the storage node, with the coupling-gate line set to the level of the power supply voltage source $V_{cc}$ to write the two bits of digital data to a 00 at another four level DRAM cell on the column, is calculated from equation 5 and shown in table 5.

TABLE 5

Calculated Node Voltage $V_A$ Under Disturb
During Data Write Operation

| Digital Data | $Q_S/C$ | $V_{AD}$ |
|---|---|---|
| 00 | $V_{CC}/2$ | $V_{CC}/2$ |
| 01 | $V_{CC}$ | $3V_{CC}/4$ |
| 10 | $3V_{CC}/2$ | $V_{CC}$ |
| 11 | $2V_{CC}$ | $5V_{CC}/4$ |

The levels of the disturbed voltage $V_{AD}$ at the storage node A will be sufficiently low as to prevent damage to the gate oxide of the transistor $M_1$ 200 and the capacitor dielectric of the trench capacitor $C_T$ 210 and the stack capacitor $C_s$ 205.

A peripheral control circuit will provide appropriate control signals for the word line voltage generators, bit line voltage generators, four level sense amplifiers, and coupling-gate voltage generators. These control signals will activate and deactivate each cell so that the two bits of digital data can be written to or read from each four level DRAM cell within the array.

Figure 5:
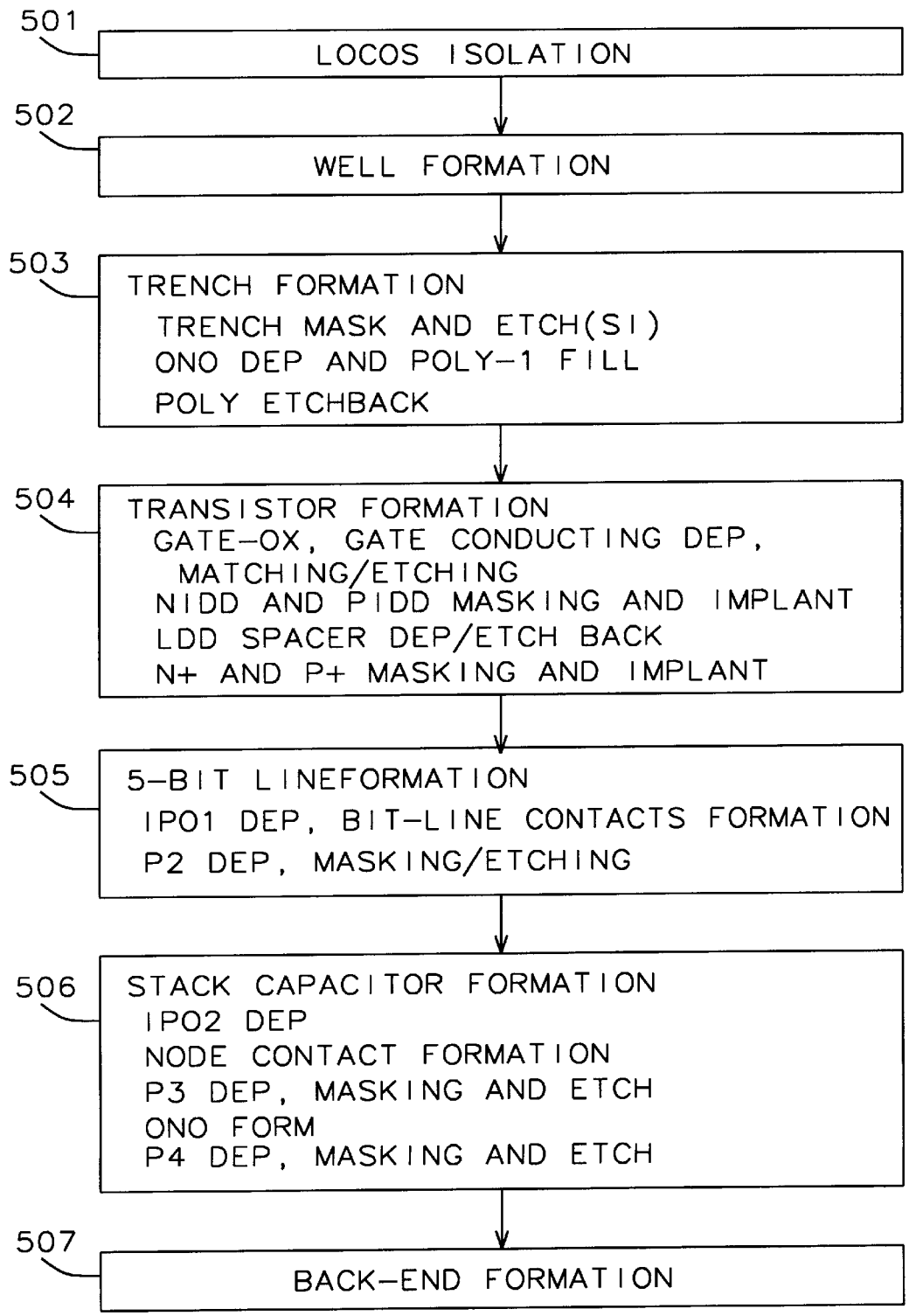
FIG. 5 is a process flow diagram of the fabrication of four level DRAM cells on a semiconductor substrate of this invention.

Refer now to FIG. 5. The process of fabricating a four level DRAM cell on a semiconductor substrate begins by the definition of the area of the four level DRAM cell by the formation of the LOCOS isolation 501 on the surface of the semiconductor substrate. The areas within the LOCOS isolation are then masked and implanted 502 to form the deep N-well and the shallower P-well.

The trench capacitor is then formed 503 by first masking and deep etching of the surface of the semiconductor substrate to form the trenches. The trenches are coated with an insulating material such as silicon dioxide, silicon nitride, or oxidized silicon nitride ONO. The trenches are then filled with a first polysilicon material to form the top plate of the trench capacitor. The first polysilicon material is then etched back such that it is level with the surface of the semiconductor substrate.

The pass transistors and transistors for the peripheral circuitry are formed 504 by first masking areas that are to define the channel regions of the transistors. A second insulating material is then deposited in the channel regions to form a gate oxide. The second insulating material will be an insulating material such as silicon dioxide, silicon nitride, or oxidized silicon nitride ONO. A conducting gate material, such as polysilicon or tungsten, will be deposited, masked, and etched back on the gate oxide to form the gates of the transistors. The gates of the pass transistors will be connected as above described to the word lines. The source and drain regions will be masked and implanted with P-type or N-type material to form lightly doped drain area PLDD/NLDD. LDD spacers are then formed adjacent to the gates of the transistors by oxide deposition and etch-back techniques that are well known in the art. The source and drain regions are masked and implanted again with P-type or N-type material to complete the formation of the drains and sources of the transistors.

The bit lines are then formed 505 by first depositing a third insulating material IPO1. The third insulating material IPO1 will be an insulating material such as silicon dioxide, silicon nitride, or oxidized silicon nitride ONO. Bit line contacts are then formed to the contacts of the sources of the pass transistors. Additionally, contacts will be formed to contact the drains of the pass transistors and the top plate of the trench capacitor. A second polysilicon material P2 is deposited, masked, and etched to form the bit lines and the interconnecting block of FIG. 3.

The stack capacitor is formed 506 by first depositing a second insulating material IPO2. The second insulating material IPO2 is an insulating material such as silicon dioxide, silicon nitride, or oxidized silicon nitride ONO. Contacts are formed to the interconnecting block. A third polysilicon material P3 is deposited, masked, and etched to form the first plate of the stack capacitor. A fourth insulating material is deposited on the first plate of the stack capacitor to form the dielectric for the stack capacitor. The fourth insulating material is an insulating material such as silicon dioxide, silicon nitride, or oxidized silicon nitride ONO.

A fourth polysilicon material P4 is deposited, masked, and etched to form the second plate of the stack capacitor.

The back-end formation 507 will provide the contacts and metalization necessary to interconnect the peripheral circuits and the circuitry of the four level DRAM array.

While this invention has been particularly shown and described with reference to the preferred embodiments thereof, it will be understood by those skilled in the art that various changes in form and details may be made without departing from the spirit and scope of the invention.

The invention claimed is:

1. A four level DRAM cell to retain two bits of digital data, fabricated on a semiconductor substrate of a material of a first conductivity type, comprising:
   a) a pass transistor having a source connected to a bit line voltage generator, a gate connected to a word line voltage generator, and a drain;
   b) a trench capacitor, formed within the semiconductor substrate, having a top plate connected to said drain and a bottom plate connected to a substrate biasing voltage source;
   c) a stack capacitor, formed above the semiconductor substrate, having a first plate connected to the drain and a second plate connected to a coupling-gate control voltage generator;
   d) an interconnecting block that will interconnect the top plate of the trench capacitor to the first plate of the stack capacitor; and
   e) an insulating layer to isolate the stack capacitor from the trench capacitor.

2. The four level DRAM cell of claim 1 wherein the pass transistor is formed in the semiconductor substrate by:
   a) creating a deep well by implanting a material of a second conductivity type into said surface of said semiconductor substrate;
   b) creating a shallow well by implanting the material of the first conductivity type into said deep well;
   c) creating the source and drain by implanting the material of the second conductivity type into said shallow well at a channel distance apart;
   d) growing a gate oxide on the surface of said semiconductor substrate in the area between the source and the drain; and
   e) creating the gate by depositing a depositing a first conductive material above the gate oxide.

3. The four level DRAM cell of claim 2 wherein the first conductive material is selected from the group of conductive materials consisting of polysilicon and tungsten.

4. The four level DRAM cell of claim 1 wherein the trench capacitor is formed in the semiconductor substrate by:
   a) etching a trench into the surface of the semiconductor substrate such that the semiconductor substrate is the bottom plate of said trench capacitor;
   b) depositing a trench dielectric on an inner surface of said trench; and
   c) filling said trench with a first polysilicon material to form the top plate of said trench capacitor.

5. The four level DRAM cell of claim 1 wherein the interconnecting block is formed by depositing a second polysilicon material on the drain and top plate to connect said drain to said top plate.

6. The four level DRAM cell of claim 1 wherein the insulating layer is formed by depositing a first insulating material on the surface of the semiconductor substrate.

7. The four level DRAM cell of claim 1 wherein the stack capacitor is formed by:
   a) depositing a third polysilicon layer upon said insulating layer and said interconnecting block to form the first plate;
   b) depositing a second insulating material upon said first plate to form a capacitor dielectric for said stack capacitor; and
   c) depositing a fourth polysilicon layer upon said capacitor dielectric to form the second plate.

8. The four level DRAM cell of claim 1 wherein the semiconductor substrate is connected to the substrate biasing voltage source.

9. The four level DRAM cell of claim 1 wherein if the two bits of digital data are to be written as both being at a first logic level, the word line voltage generator will be boosted to a level greater than a power supply voltage source to activate said pass transistor, the bit line voltage generator will be set to a level approximately on half the power supply voltage source, the coupling-gate voltage generator will be set to a level approximately that of the power supply voltage source, and the substrate biasing voltage source will be set to a level that is the negative of one half of the power supply voltage source.

10. The four level DRAM cell of claim 1 wherein if the first of the two bits of digital data is to be written as being at a second logic level and the second of the two bits of digital data is to be written at the first logic level, the word line voltage generator will be boosted to a level greater than a power supply voltage source to activate said pass transistor, the bit line voltage generator will be set to a level approximately on half the power supply voltage source, the coupling-gate voltage generator will be set to a level approximately that of one half of the power supply voltage source, and the substrate biasing voltage source will be set to a level that is the negative of one half of the power supply voltage source.

11. The four level DRAM cell of claim 1 wherein if the first of the two bits of digital data is to be written as being at the first logic level and the second of the two bits of digital data is to be written at a second logic level, the word line voltage generator will be boosted to a level greater than a power supply voltage source to activate said pass transistor, the bit line voltage generator will be set to a level approximately on half the power supply voltage source, the coupling-gate voltage generator will be set to a level approximately that of the ground reference potential, and the substrate biasing voltage source will be set to a level that is the negative of one half of the power supply voltage source.

12. The four level DRAM cell of claim 1 wherein if the two bits of digital data is to be written as being at the second logic level, the word line voltage generator will be boosted to a level greater than a power supply voltage source to activate said pass transistor, the bit line voltage generator will be set to a level approximately on half the power supply voltage source, the coupling-gate voltage generator will be set to a level approximately that is the negative of one half that of the power supply voltage source, and the substrate biasing voltage source will be set to a level that is the negative of one half of the power supply voltage source.

13. The four level DRAM cell of claim 1 wherein a four level charge sense amplifier is connected to said bit line to sense a level of charge representing the two bits of digital data retained within said four level DRAM cell.

14. The four level DRAM cell of claim 13 wherein said four level DRAM cell is read by setting the word line voltage generator will be boosted to a level greater than a power supply voltage source to activate said pass transistor, the bit line voltage generator will be set to a level approximately on half the power supply voltage source to precharge said bit line, the coupling-gate voltage generator will be set to a level that is the ground reference potential, and the substrate biasing voltage source will be set to a level that is the negative of one half of the power supply voltage source.

15. An integrated circuit memory to retain digital data, fabricated on a semiconductor substrate having a surface implanted with a material of a first conductivity type, comprising:
   a) a plurality of four level DRAM cells arranged in a plurality of rows and columns, whereby each four level DRAM cell comprises:
      a pass transistor having a source connected to a bit line voltage generator, a gate connected to a word line voltage generator, and a drain,
      a trench capacitor, formed within the semiconductor substrate, having a top plate connected to said drain and a bottom plate connected to a substrate biasing voltage source,
      a stack capacitor, formed above the semiconductor substrate, having a first plate connected to the drain and a second plate connected to a coupling-gate control voltage generator,
      an interconnecting block that will interconnect the top plate of the trench capacitor to the first plate of the stack capacitor, and
      an insulating layer to isolate the stack capacitor from the trench capacitor;
   b) a plurality of word lines, whereby each word line is located on each row of the four level DRAM cells and connected to the gate of the pass transistor on each row of the four level DRAM cells;
   c) a plurality of bit lines, whereby each bit line is located on each column of four level DRAM cells and whereby the bit line is connected to the source of the pass transistor of each four level DRAM cell on each column of four level DRAM cells;
   d) a plurality of coupling-gate lines, whereby each coupling-gate line is located on a column of four level DRAM cells and connected to the second plate of said stacked gate capacitor of each four level DRAM cell on each column;
   e) a plurality of word line control circuits whereby each word line control circuit is couple to each word line to select all the four level DRAM cells of one row of four level DRAM cells;
   f) a plurality of bit line control circuits whereby each bit line control circuit is connected to one bit line to establish a necessary bit line voltage level during a writing and reading of said four level DRAM cells on a column of four level DRAM cells;
   g) a plurality of four level sense amplifiers, whereby each four level sense amplifier is connected to one bit line to sense a level of charge representing the two bits of digital data retained within said four level DRAM cell;
   h) a plurality of coupling-gate control circuits, whereby each coupling-gate control circuit is coupled to one of said coupling-gate lines to provide a necessary coupling-gate voltage level during writing and reading of said four level DRAM cells on a column of four level DRAM cells; and
   i) a peripheral control circuit to provide control signals for the plurality of word line control circuits, bit line control circuits, four level sense amplifiers, and coupling-gate control circuits.

16. The integrated circuit memory of claim 15 wherein the pass transistor of the four level DRAM cell is formed in the semiconductor substrate by:
   a) creating a deep well by implanting a material of a second conductivity type into said surface of said semiconductor substrate;
   b) creating a shallow well by implanting the material of the first conductivity type into said deep well;
   c) creating the source and drain by implanting the material of the second conductivity type into said shallow well at a channel distance apart;
   d) growing a gate oxide on the surface of said semiconductor substrate in the area between the source and the drain; and
   e) creating the gate by depositing a depositing a first conductive material above the gate oxide.

17. The integrated circuit memory of claim 16 wherein the first conductive material is selected from the group of conductive materials consisting of polysilicon and tungsten.

18. The integrated circuit memory of claim 15 wherein the trench capacitor of the four level DRAM cell is formed in the semiconductor substrate by:
   a) etching a trench into the surface of the semiconductor substrate such that the semiconductor substrate is the bottom plate of said trench capacitor;
   b) depositing a trench dielectric on an inner surface of said trench; and
   c) filling said trench with a first polysilicon material to form the top plate of said trench capacitor.

19. The integrated circuit memory of claim 15 wherein the interconnecting block of the four level DRAM cell is formed by depositing a second polysilicon material on the drain and top plate to connect said drain to said top plate.

20. The integrated circuit memory of claim 15 wherein the insulating layer of the four level DRAM cell is formed by depositing a first insulating material on the surface of the semiconductor substrate.

21. The integrated circuit memory of claim 15 wherein the stack capacitor of the four level DRAM cell is formed by:
   a) depositing a fifth polysilicon layer upon said insulating layer and said interconnecting block to form the first plate;
   b) depositing a second insulating material upon said first plate to form a capacitor dielectric for said stack capacitor; and
   c) depositing a sixth polysilicon layer upon said capacitor dielectric to form the second plate.

22. The integrated circuit memory of claim 15 wherein the semiconductor substrate is connected to the substrate biasing voltage source.

23. The integrated circuit memory of claim 15 wherein if the two bits of digital data are to be written as both being at a first logic level, the word line voltage generator will be boosted to a level greater than a power supply voltage source to activate said pass transistor, the bit line voltage generator will be set to a level approximately on half the power supply voltage source, the coupling-gate voltage generator will be set to a level approximately that of the power supply voltage source, and the substrate biasing voltage source will be set to a level that is the negative of one half of the power supply voltage source.

24. The integrated circuit memory of claim 15 wherein if the first of the two bits of digital data is to be written as being at a second logic level and the second of the two bits of digital data is to be written at the first logic level, the word line voltage generator will be boosted to a level greater than a power supply voltage source to activate said pass transistor, the bit line voltage generator will be set to a level approximately on half the power supply voltage source, the coupling-gate voltage generator will be set to a level approximately that of one half of the power supply voltage source, and the substrate biasing voltage source will be set to a level that is the negative of one half of the power supply voltage source.

25. The integrated circuit memory of claim 15 wherein if the first of the two bits of digital data is to be written as being at the first logic level and the second of the two bits of digital data is to be written at a second logic level, the word line voltage generator will be boosted to a level greater than a power supply voltage source to activate said pass transistor, the bit line voltage generator will be set to a level approximately on half the power supply voltage source, the coupling-gate voltage generator will be set to a level approximately that of the ground reference potential, and the substrate biasing voltage source will be set to a level that is the negative of one half of the power supply voltage source.

26. The integrated circuit memory of claim 15 wherein if the two bits of digital data is to be written as being at the second logic level, the word line voltage generator will be boosted to a level greater than a power supply voltage source to activate said pass transistor, the bit line voltage generator will be set to a level approximately on half the power supply voltage source, the coupling-gate voltage generator will be set to a level approximately that is the negative of one half that of the power supply voltage source, and the substrate biasing voltage source will be set to a level that is the negative of one half of the power supply voltage source.

27. The integrated circuit memory of claim 15 wherein a four level charge sense amplifier is connected to said bit line to sense a level of charge representing the two bits of digital data retained within said four level DRAM cell.

28. The integrated circuit memory of claim 27 wherein one four level DRAM cell is read by setting the word line voltage generator will be boosted to a level greater than a power supply voltage source to activate said pass transistor, the bit line voltage generator will be set to a level approximately on half the power supply voltage source to precharge said bit line, the coupling-gate voltage generator will be set to a level that is the ground reference potential, and the substrate biasing voltage source will be set to a level that is the negative of one half of the power supply voltage source.

* * * * *